United States Patent [19]
Kitamura et al.

[11] Patent Number: 5,917,217
[45] Date of Patent: Jun. 29, 1999

[54] LATERAL FIELD EFFECT TRANSISTOR AND METHOD OF MANUFACTURING THE SAME

[75] Inventors: Akio Kitamura; Naoto Fujishima, both of Nagano, Japan

[73] Assignee: Fuji Electric Co., Ltd., Tokyo, Japan

[21] Appl. No.: 08/926,343

[22] Filed: Sep. 9, 1997

Related U.S. Application Data

[63] Continuation of application No. 08/534,013, Sep. 26, 1995, abandoned.

[30] Foreign Application Priority Data

Oct. 3, 1994 [JP] Japan ................................. 6-238716

[51] Int. Cl.⁶ .................................................. H01L 29/76
[52] U.S. Cl. ........................... 257/343; 257/339; 257/492
[58] Field of Search ..................... 257/343, 336, 257/339, 137, 378, 264, 492, 493; 437/39

[56] References Cited

U.S. PATENT DOCUMENTS

| | | | |
|---|---|---|---|
| 4,300,150 | 11/1981 | Colak | 257/336 |
| 4,551,909 | 11/1985 | Cogan et al. | 257/264 |
| 4,994,904 | 2/1991 | Nakagawa et al. | 257/336 |
| 5,237,186 | 8/1993 | Nakagawa et al. | 257/343 |
| 5,286,995 | 2/1994 | Malhi | 257/343 |
| 5,304,827 | 4/1994 | Malhi et al. | 257/262 |
| 5,306,652 | 4/1994 | Kwon et al. | 437/40 |

OTHER PUBLICATIONS

National Convention Record IEE Japan No. 451 (1993).

Primary Examiner—Sara Crane
Attorney, Agent, or Firm—Baker & Botts, L.L.P.

[57] ABSTRACT

A lateral field effect transistor improves the trade-off relationship between the breakdown voltage and on-resistance of a lateral MOSFET integrated into a power IC. A MOSFET is formed by forming a p-type well region on a p-type substrate, and an n-type drain region accompanying an n-type offset region on the well region. A thick oxide film is disposed on the offset region. The surface concentration of the offset region is, preferably, from $5 \times 10^{16}$ to $2 \times 10^{17}$ cm$^{-3}$ and the diffusion depth thereof is from 0.5 to 1.5 $\mu$m. The maximum impurity concentration of a p-type well region is preferably adjusted to be from $5 \times 10^{15}$ to $3 \times 10^{16}$ cm$^{-3}$. By the shallow junction depth of the offset region that promotes depletion thereof, the breakdown voltage is increased. Also, by the high maximum impurity concentration of the well region of from $5 \times 10^{15}$ to $3 \times 10^{16}$ cm$^{-3}$, the on-resistance is lowered. Thus, the trade-off relationship between the breakdown voltage and on-resistance is improved. Specifically, the breakdown voltage is improved to 95 V and the on-resistance to 0.17 $\omega$mm$^{-2}$. Certain processing steps may be employed commonly to integrate the CMOS and the n-channel MOSFET into the same substrate.

11 Claims, 9 Drawing Sheets

LATERAL FIELD EFFECT TRANSISTOR AND METHOD OF MANUFACTURING THE SAME

This application is a continuation of application Ser. No. 08/534,013, filed on Sep. 26, 1995, now abandoned.

SPECIFICATION

1. Technical Field of the Invention

The present invention relates to a structure of a lateral field effect transistor (hereinafter referred to as "MOSFET") that has a high breakdown voltage and is used, in a form of a power transistor or a power IC into which the MOSFETs are integrated with a logic circuit, in power supplies, automobiles, etc. or for driving motors, display panels, etc. The present invention relates also to a method of manufacturing the MOSFETs.

2. Background of the Invention

Figure 9:
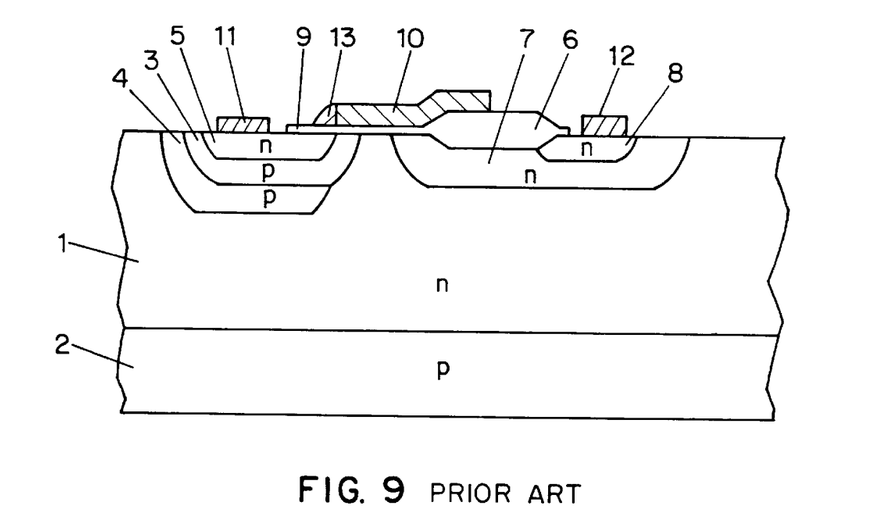
FIG. 9 is a cross section of a conventional n-channel MOSFET with high breakdown voltage.

Various attempts have been made to improve the trade-off relationship between the high breakdown voltage and low on-resistance of MOSFETs. FIG. 9 is a cross section of a lateral MOSFET having a breakdown voltage of from several tens to 100 V previously proposed to improve this trade-off relationship (See, e.g., N. Fujishima et al., ISPSD '93). The lateral MOSFET in FIG. 9 has a p-type substrate 1 on which is grown an n-type epitaxial layer 2. A p-type base region 3 and a deep p-type base region 4 partly overlapping each other are formed in a surface layer of the n-type epitaxial layer 2. An n-type source region 5 is formed in a surface layer of the p-type base region 3. An n-type offset region 7 with a thick oxide film (LOCOS) 6 disposed thereon is formed in a surface layer of the n-type epitaxial layer 2. The n-type offset region 7 is laterally positioned by a narrow spacing from the p-type base region 3. An n-type drain region 8 is formed in a surface layer of the n-type offset region 7. The drain region 8 is spaced by the LOCOS 6 away from the p-type base region 3. A polycrystalline silicon gate electrode 10 is fixed via a gate oxide film 9 to a portion of the p-type base region 3 extending between the n-type epitaxial layer 2 and the n-type source region 5. A source electrode 11 is fixed to the n-type source region 5. A drain electrode 12 is fixed to the n-type drain region 8. A side wall 13 is formed on a side face of the gate electrode 10.

The MOSFET structure described above is obtained as follows: First, the deep p-type base region 4 is formed. Then, the base region 3 is formed by implanting and thermally diffusing acceptor type impurity ions using the gate electrode 10 as a masking. Then, the side wall 13 is grown by the CVD method. Finally, the source region 5 is formed by implanting and thermally diffusing donor-type impurity ions. The MOSFET is operated by applying a voltage higher than the threshold value to the gate electrode 10 to form an inversion layer so that the source electrode 11 and the drain electrode 12 are electrically connected with one another. In this structure, the p-type base region 3 and the n-type base region 5 are formed without using any self-alignment technique. The p-type base region 3 and the n-type base region 5 are displaced laterally from each other by inserting the formation of the side wall 13 between the formations of the p-type base region 3 and the n-type base region 5 to reduce the base resistance (channel resistance) and to improve the punch-through breakdown voltage. By reducing the base resistance and improving the punch-through breakdown voltage, a high breakdown voltage of 80 V and low on-resistance of 0.143 $\omega mm^{-2}$ have been realized in the MOSFET.

Figure 10:
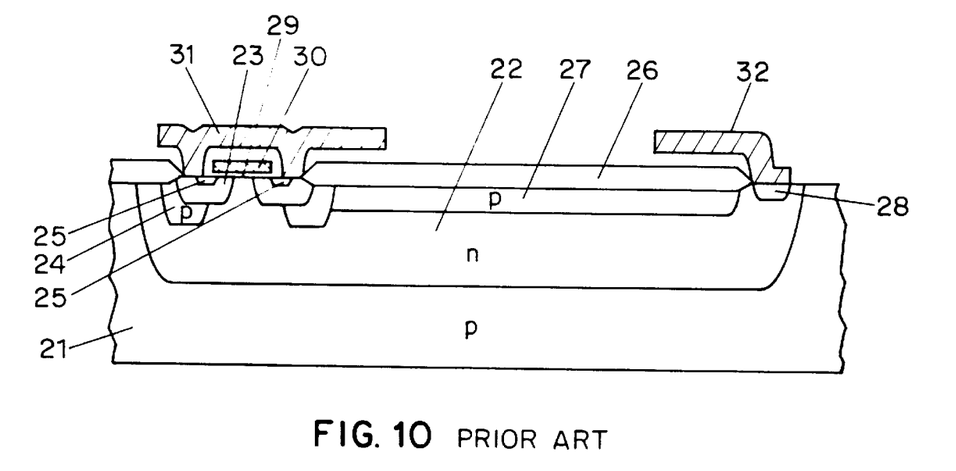
FIG. 10 is a cross section of a conventional p-channel MOSFET with high breakdown voltage.

FIG. 10 is a cross section of another lateral MOSFET showing a breakdown voltage of several hundred volts previously proposed (See, e.g., A. Kitamura et al., 1993 National Convention Record I.E.E. Japan No. 451). The lateral MOSFET in FIG. 10 has a p-type substrate 21 on which is grown an n-type well region 22. A p-type base region 23 and a deep p-type base region 24 partly overlapping each other are formed in a surface layer of the n-type well region 22. An n-type source region 25 is formed in a surface layer of the p-type base region 23. An expanded p-type base region 27 with a thick oxide film (LOCOS) 26 disposed thereon is formed in a surface layer of the n-type well region 22. The expanded p-type base region 27 is connected with the p-type base region 23. An n-type drain region 28 is formed in the surface layer of the n-type well region 22 laterally spaced through the base region 27 away from the base region 23. A polycrystalline silicon gate electrode 30 is fixed via a gate oxide film 29 to a portion of the p-type base region 23 extending between the n-type well region 22 and the n-type source region 25. A source electrode 31 is fixed to the n-type source region 25. A drain electrode 32 is fixed to the n-type drain region 28. The impurity concentration in the n-type well region 22 is increased by sandwiching the n-type well region 22 vertically between the expanded p-type base region 27 and the p-type substrate 21. As a result, the on-resistance has been reduced, and a high breakdown voltage of 700 V has been realized.

Since the MOSFET of FIG. 9 having a gate electrode with a side wall uses an epitaxial wafer as its substrate and needs many sheets of masking in its processing, its processing cost is very expensive. As for the MOSFET of FIG. 10 having an expanded p-type base region 27, high performance has been confirmed in the 700 V class device showing a high breakdown voltage. However, any high performance has not been reported so far in the devices of lower breakdown voltage class.

SUMMARY OF THE INVENTION

It is an object of the present invention to provide a MOSFET that does not need any specific manufacturing process and that improves the trade-off relationship between the breakdown voltage and the on-resistance. It is also an object of the present invention to provide a method of manufacturing such a MOSFET.

In accordance with the present invention, a lateral field effect transistor comprises: a semiconductor layer of a first conductivity type; a well region of the first conductivity type formed by implanting and diffusing impurity ions from the surface of the semiconductor layer; a source region of a second conductivity type formed by implanting and diffusing impurity ions into the surface of the well region; and an offset region of the second conductivity type formed by implanting and diffusing impurity ions into the surface of the well region, the offset region being spaced laterally from the source region. In addition, the transistor, preferably, comprises: a thick oxide film formed on a part of the offset region; a drain region of the second conductivity type formed in a surface layer of the offset region, the drain region being spaced by the thick oxide film away from the source region; a polycrystalline silicon gate electrode fixed via a gate insulation film to the portion of the well region extending between the source region and the offset region; a source electrode fixed to the source region; and a drain electrode fixed to the drain region.

The inventive lateral field effect transistor may also be formed on a semiconductor layer of a second conductivity type.

The inventive lateral field effect transistor is preferably provided with a base region of the first conductivity type, which base region surrounds the source region laterally and from the bottom thereof, and is doped more heavily than the well region.

It is preferable to adjust the surface concentration of the offset region to be from $5 \times 10^{16}$ cm$^{-3}$ to $2 \times 10^{17}$ cm$^{-3}$, the diffusion depth thereof to be from 0.5 µm to 1.5 µm, and the maximum impurity concentration of the well region beneath the offset region to be from $5 \times 10^{15}$ cm$^{-3}$ to $3 \times 10^{16}$ cm$^{-3}$.

According to another aspect of the present invention, the well region of the MOSFET is formed simultaneously with a well region of the first conductivity type of a CMOS transistor formed on the semiconductor layer, thereon the well region of the MOSFET is to be formed.

By forming a well region of the first conductivity type on a semiconductor layer of the first or the second conductivity type and by forming an offset region in a surface layer of the well region, not only the well region, but also the offset region, are caused to be depleted and a high maximum impurity concentration of the well region is realized.

To control the threshold voltage, the lateral field effect transistor has a base region of the first conductivity type, which base region surrounds the source region laterally and from the bottom thereof, and is doped more heavily than the well region.

Especially when the surface concentration of the offset region is from $5 \times 10^{16}$ cm$^{-3}$ to $2 \times 10^{17}$ cm$^{-3}$, the diffusion depth thereof is from 0.5 µm to 1.5 µm, and the maximum impurity concentration of the well region beneath the offset region is from $5 \times 10^{15}$ cm$^{-3}$ to $3 \times 10^{16}$ cm$^{-3}$, the offset region is caused to be depleted and a high maximum impurity concentration of the well region is realized.

In addition, the semiconductor devices, which integrate a CMOSFET with the MOSFET, can be simply manufactured with no extra processing steps by applying the processing steps of the well region and the drain region of the CMOS to the processing of the MOSFET.

Hereinafter, the present invention will be explained with reference to the accompanied drawing figures which illustrate preferred embodiments of the invention.

DETAILED DESCRIPTION OF THE INVENTION

Figure 1:
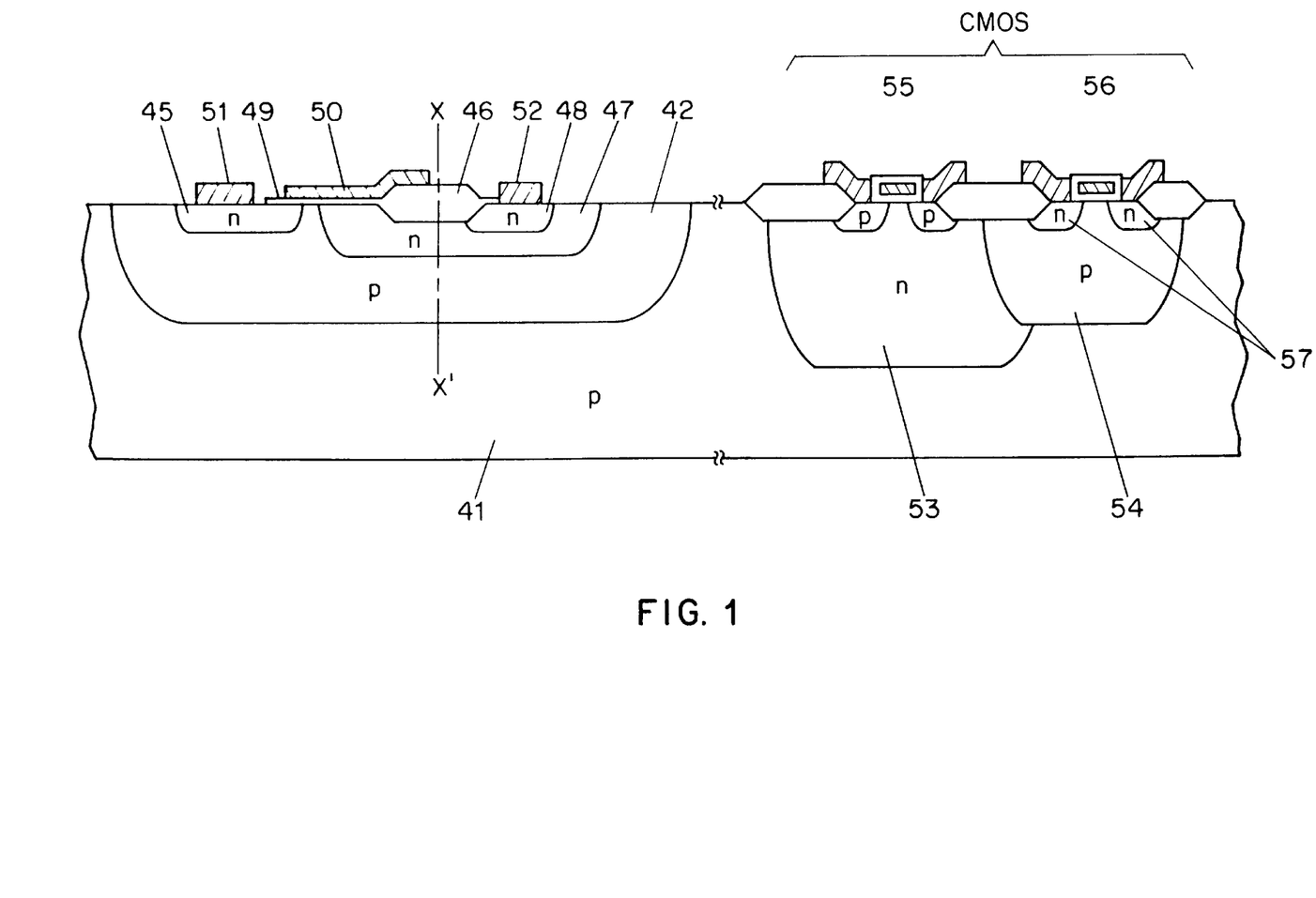
FIG. 1 is a cross section of an integrated circuit including a first embodiment of an n-channel MOSFET with high breakdown voltage according to the present invention.

FIG. 1 is a cross section showing a first embodiment of the MOSFET in accordance with the invention on the left hand side of the figure. On the right hand side of FIG. 1, a CMOS transistor (n-channel MOSFET, p-channel MOSFET) is shown integrated into the same silicon substrate as the MOSFET of the invention. A p-type well region 42 is formed by selectively implanting and consecutively diffusing acceptor type impurities in a surface layer of a p-type substrate 41 having a specific resistivity of 15 ω·cm . The surface concentration of the p-type well region 42 is $1 \times 10^{16}$ cm$^{-3}$, and the junction depth thereof is 3 µm. An n-type offset region 47 and an n-type source region 45 are formed leaving a narrow space in-between by selectively implanting and consecutively diffusing acceptor type impurities in a surface layer of the p-type well region 42. A thick oxide film (LOCOS) 46 is deposited on the n-type offset region 47. An n-type drain region 48 is formed in the surface layer of the n-type offset region 47 laterally spaced by the LOCOS 46 away from the source region 45. The surface concentration of the offset region 47 is $6 \times 10^{16}$ cm$^{-3}$, and the junction depth thereof is 1 µm. A gate electrode 50 is fixed via a gate oxide film 49 to a portion of the p-type well region 42 extending between the n-type offset region 47 and the n-type source region 45. A source electrode 51 is fixed to the n-type source region 45. A drain electrode 52 is fixed to the n-type drain region 48. The MOSFET is operated, similarly as in the usual MOSFETs, by applying a voltage higher than the threshold value to the gate electrode 50 to electrically connect the source electrode 51 and the drain electrode 52.

The CMOS, shown on the right hand side of FIG. 1, consists of a p-channel MOSFET 55 and an n-channel MOSFET 56. The p-channel MOSFET 55 has an n-type well region 53 formed in a surface layer of the substrate 41, and a source region and a drain region formed on the well region 53. The n-channel MOSFET 56 has a p-type well region 54 formed in a surface layer of the substrate 41, and a source region and a drain region formed on the well region 54. When the CMOS and the high breakdown voltage MOSFET are integrated into the same substrate 41, the p-type well region 42 may be simultaneously formed with p-type well region 54 constituting the n-channel MOSFET 56 of the CMOS. In this arrangement, since both well regions 42 and 54 can be formed by means of one sheet of masking, it is not necessary to prepare an exclusive masking for forming the high breakdown voltage MOSFET. Moreover, the n-type source region 45 and the n-type drain region 48 may be simultaneously formed with the n-type source region and the n-type drain region 57 constituting the n-channel MOSFET 56 of the CMOS.

Figure 2:
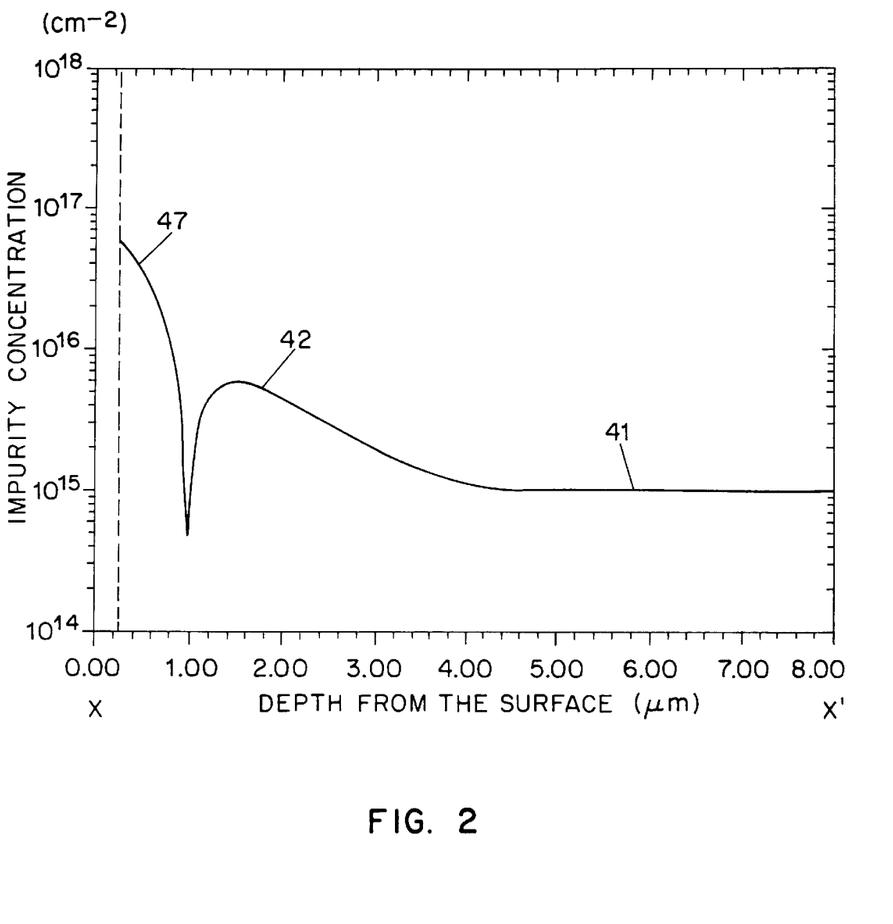
FIG. 2 is a chart showing the distribution of impurity concentration on a section along the line X-X' of FIG. 1.

FIG. 2 is a chart showing the distribution of impurity concentration on a section along the line X-X' of FIG. 1. FIG. 2 indicates that due to the shallow junction depth of 1 µm of the n-type offset region 47, the maximum impurity concentration of the p-type well region 42 beneath the offset region 47 is very high, i.e. $6 \times 10^{15}$ cm$^{-3}$.

The breakdown voltage of the MOSFET of FIG. 1 is 95 V, and its on-resistance is 0.17 ωmm$^{-2}$. The high breakdown voltage has been realized by promoting depletion of the offset region 47 through optimization of its impurity concentration and the low on-resistance has been realized by increasing the impurity concentrations in the p-type well region 42 through its shallow diffusion depth.

Figure 3:
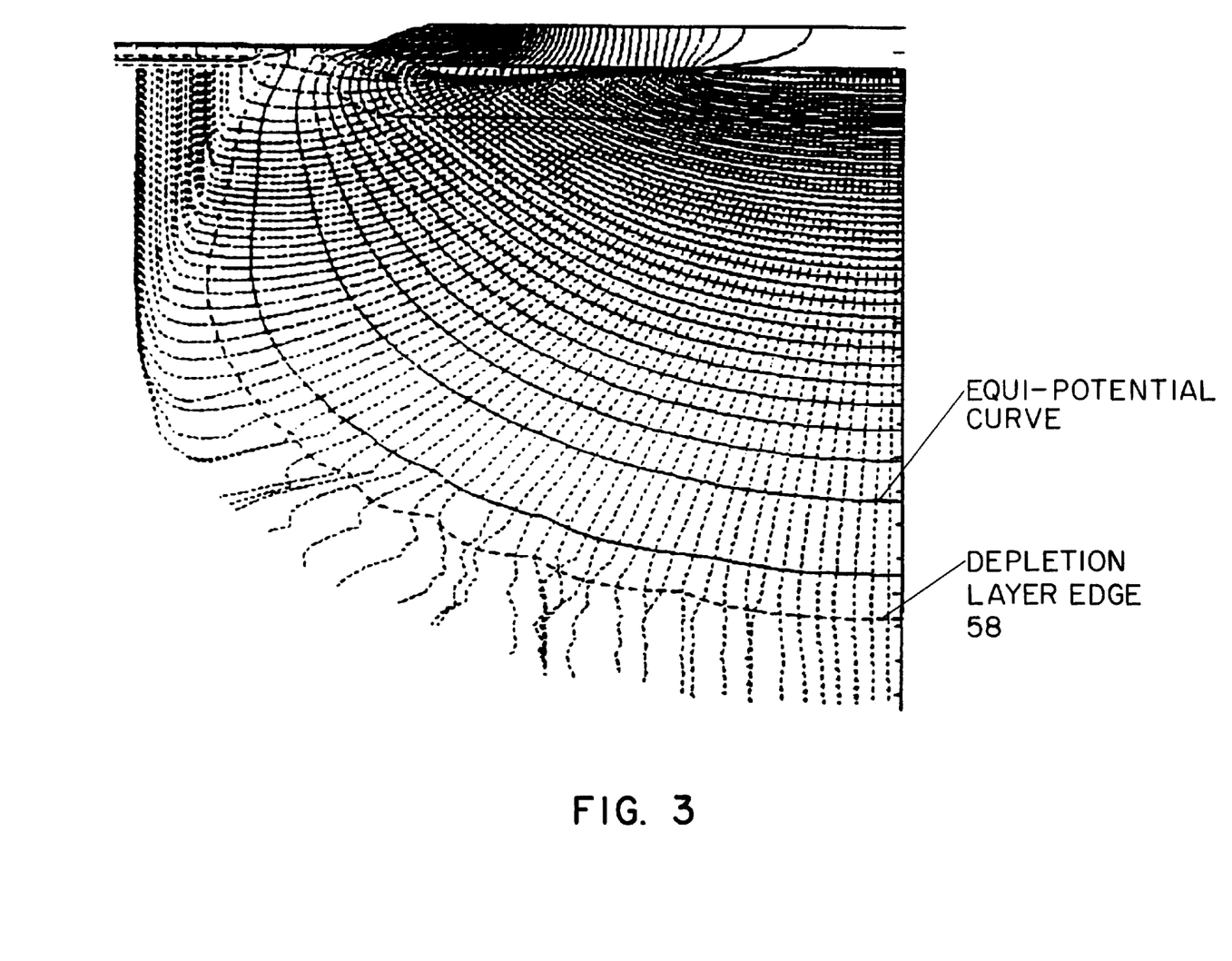
FIG. 3 is a chart showing the potential distribution in the n-channel MOSFET of FIG. 1.

FIG. 3 is a chart showing the potential distribution when a reverse bias is applied. As FIG. 3 shows, the n-type offset region 47 is completely depleted in spite of its high impurity concentration of $6\times10^{16}$ cm$^{-3}$. The high breakdown voltage may also be seen from fairly uniform distribution of the equi-potential curves shown by solid curves. A broken curve 58 represents an edge of the depletion layer.

Thus, the trade-off relationship between the breakdown voltage and the on-resistance has been improved, without using any extra masking for forming the p-type wells, by limiting the diffusion depth of the n-type offset region 47 to a shallow 1 μm by means of the impurity distribution of the p-type well region 42.

Figure 4:
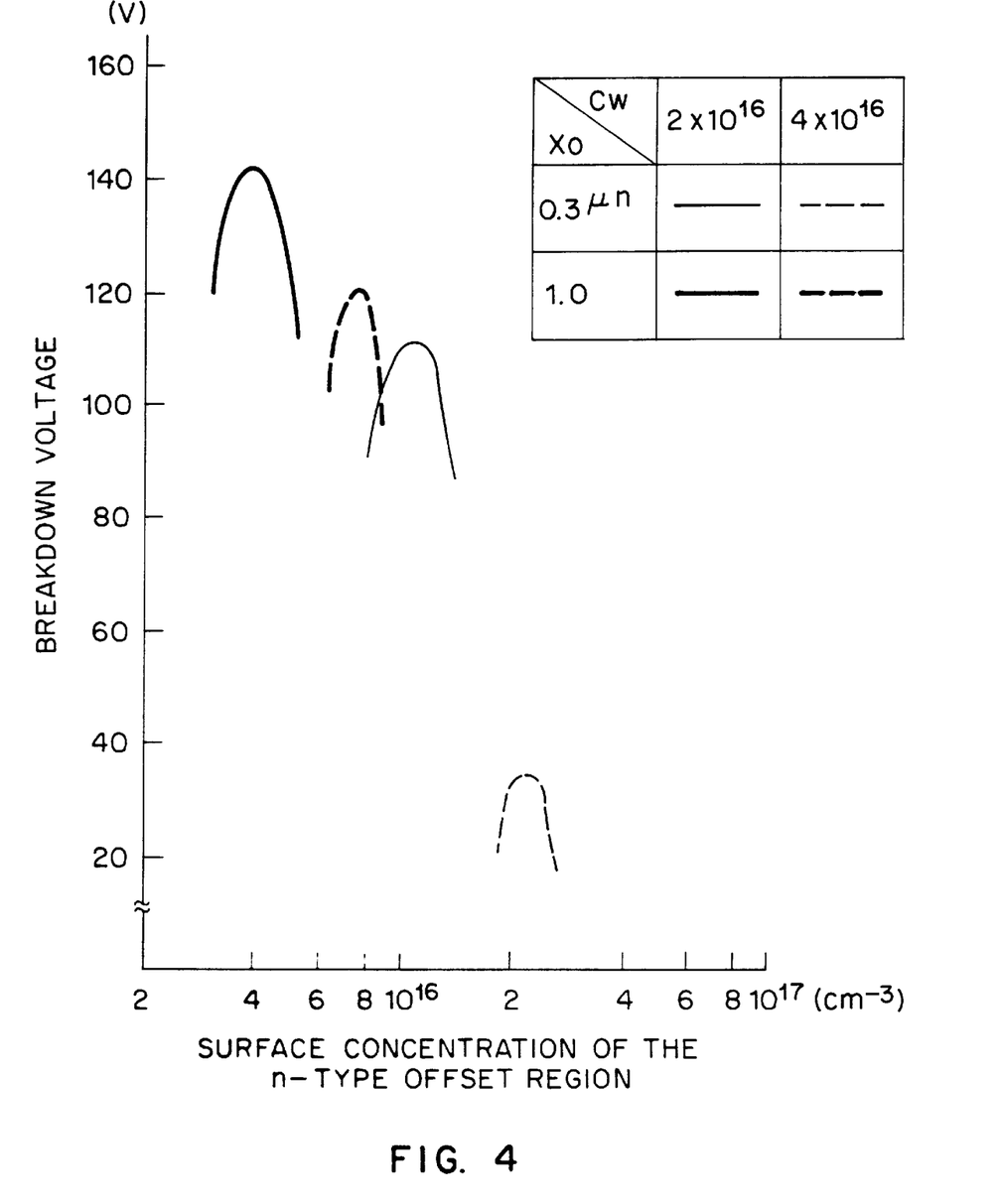
FIG. 4 is a correlation chart showing the effects of the surface impurity concentration, junction depth, and the maximum impurity concentration of the p-type well region on the breakdown voltage of the n-channel MOSFET of FIG. 1.

FIG. 4 is a set of curves showing the relationship between the breakdown voltage and the surface concentration of the n-type offset region 47 with the impurity concentration of the p-type well region 42 and the diffusion depth of the n-type offset region 47 as parameters. The x-axis represents the surface concentration of the n-type offset region 47, and the y-axis represents the breakdown voltage. The solid curves correspond to the maximum concentration of $2\times10^{16}$ cm$^{-3}$ in the p-type well region 42, and the broken curves to the maximum concentration of $4\times10^{16}$ cm$^{-3}$ in that region. The fine curves correspond to the junction depth of 0.3 μm of the n-type offset region 47, and the bold curves to the junction depth of 1.0 μm. The breakdown voltage increases with increasing surface concentration of the n-type offset region 47, reaches a maximum, and then decreases as the surface concentration further increases. That is, an optimum surface concentration of the n-type offset region 47 exists when the breakdown voltage shows the maximum.

The breakdown voltage peak rises with lower impurity concentration of the p-type well region 42 and with deeper diffusion depth of the n-type offset region 47. The breakdown voltage peak also rises with shallower diffusion depth of the p-type well region 42. However, the breakdown voltage is not affected by the diffusion depth of the p-type well region 42 as greatly as by the other parameters. Though not illustrated in the figure, a result has also been obtained in that the on-resistance increases with lower impurity concentration of the p-type well region 42 and with deeper diffusion depth of the n-type offset region 47. The diffusion depth of the p-type well region 42 does not affect the on-resistance as greatly as other parameters also. Therefore, an optimum range is determined for each of three influential parameters described above. The optimum ranges include the surface concentration of from $5\times10^{16}$ cm$^{-3}$ to $2\times10^{17}$ cm$^{-3}$ for the n-type offset region 47, the diffusion depth of from 0.5 to 1.5 μm for the n-type offset region 47, and the impurity concentration of from $5\times10^{15}$ cm$^{-3}$ to $3\times10^{16}$ cm$^{-3}$ for the p-type well region 42. In these optimum ranges, the breakdown voltage of 90 V or more and the on-resistance of 0.5 ωmm$^2$ or less are realized.

Figure 5:
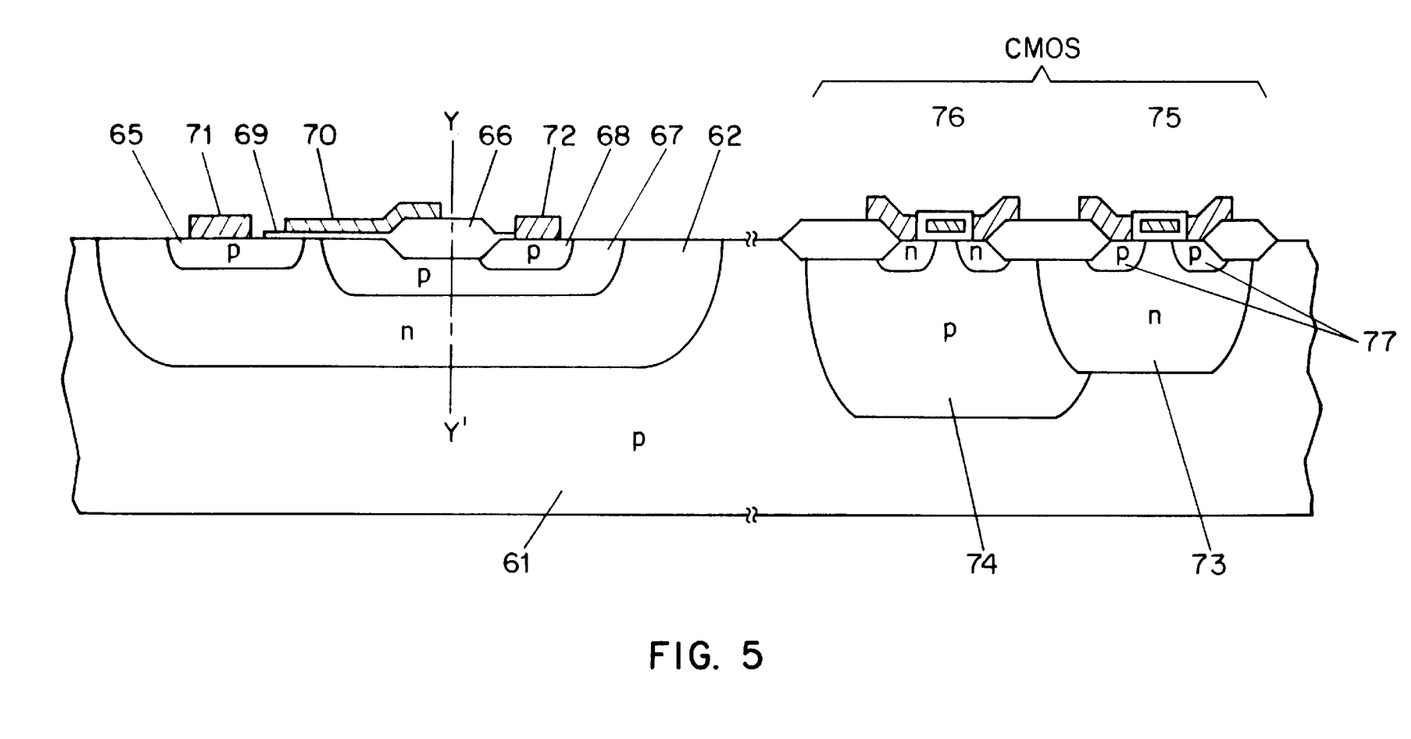
FIG. 5 is a cross section of an integrated circuit including a second embodiment of a p-channel MOSFET according to the present invention.

FIG. 5 is a cross section showing a second embodiment of the present invention on the left hand side of the figure. On the right hand side of FIG. 4, a CMOS transistor (n-channel MOSFET, p-channel MOSFET) is shown integrated into a same silicon substrate with the MOSFET of the invention. An n-type well region 62 is formed in a surface layer of a p-type substrate 61 of 15 ω·cm in its specific resistivity. The impurity concentration of the n-type well region 62 is $3\times10^{16}$ cm$^{-3}$, and the junction depth thereof is 4 μm. A p-type source region 65, a p-type offset region 67 and a p-type drain region 88 are formed in a surface layer of the n-type well region 62. As in the first embodiment, a thick oxide film (LOCOS) 66 is deposited on the p-type offset region 67. A p-type drain region 68 is formed in the surface layer of the p-type offset region 67. The surface concentration of the offset region 67 is $5\times10^{16}$ cm$^{-3}$, and the junction depth thereof is 1 μm. A gate electrode 70 is fixed via a gate oxide film 69 to the p-type offset region 67. In this embodiment, the n-type well region 62 may be simultaneously formed with n-type well region 73 constituting a p-channel MOSFET 75 of the CMOS. In this arrangement, since both well regions 62 and 73 can be formed through one masking, it is not necessary to prepare any exclusive masking for forming the high breakdown voltage p-channel MOSFET.

Figure 6:
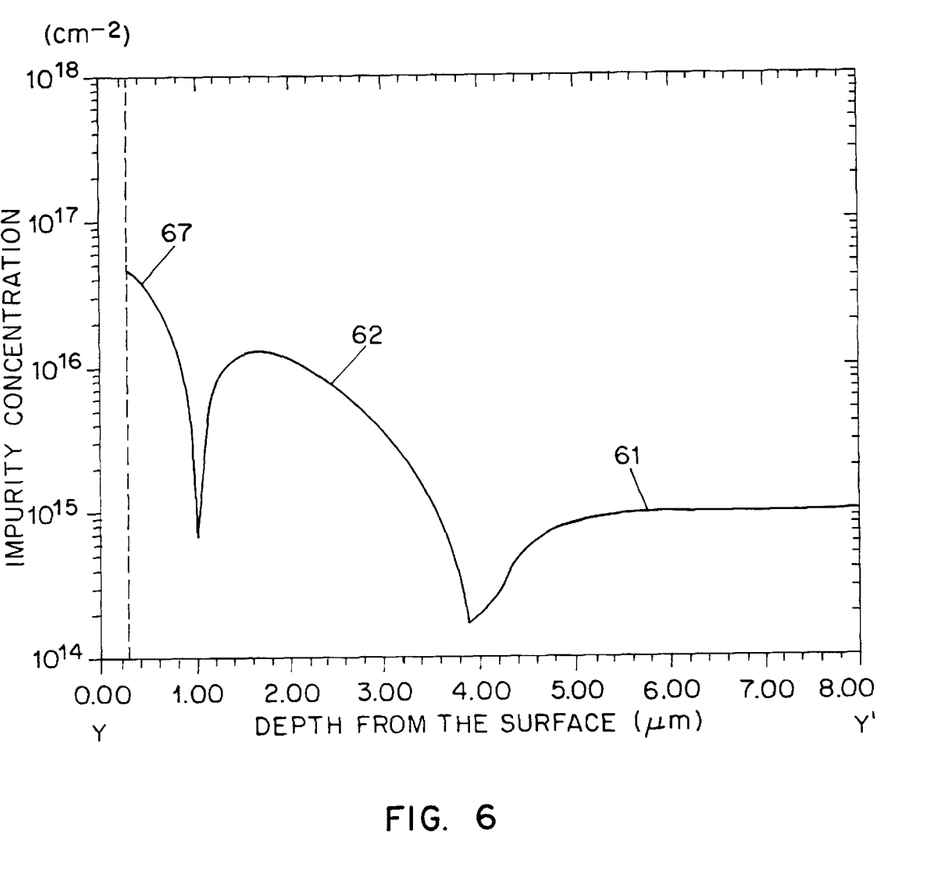
FIG. 6 is a chart showing the distribution of impurity concentration on a section along the line Y-Y' of FIG. 5.

FIG. 6 is a chart showing the distribution of impurity concentration on a section along the line Y-Y' of FIG. 5. FIG. 6 indicates that due to the shallow junction depth of 1 μm of the p-type offset region 67, the maximum impurity concentration of the n-type well region 62 beneath the offset region 67 is very high $1.5\times10^{16}$ cm$^{-3}$. The breakdown voltage of the p-channel MOSFET of FIG. 5 is 80 V, and its on-resistance is 0.4 ωmm$^{-2}$. Thus, by limiting the diffusion depth of the offset region 67 to shallow 1 μm, the trade-off relationship between the breakdown voltage and the on-resistance is improved.

Figure 7:
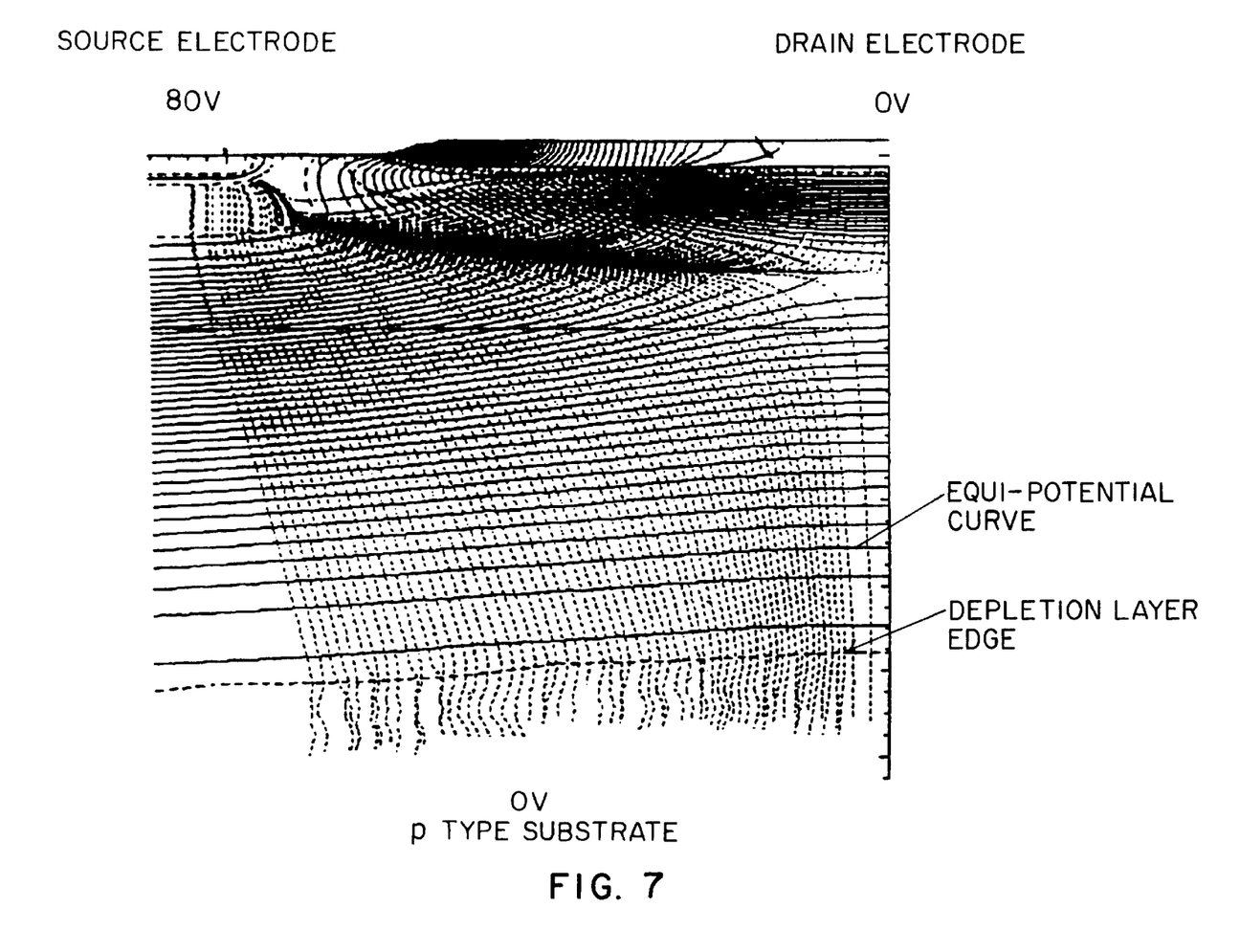
FIG. 7 is a chart showing the potential distribution in the p-channel MOSFET of FIG. 5.

FIG. 7 is a chart showing the potential distribution when a reverse bias is applied. As FIG. 7 shows, the p-type offset region 67 is completely depleted in spite of its high surface concentration of $5\times10^{16}$ cm$^{-3}$. The high breakdown voltage may also be seen from fairly uniform distribution of the equi-potential curves.

Figure 8:
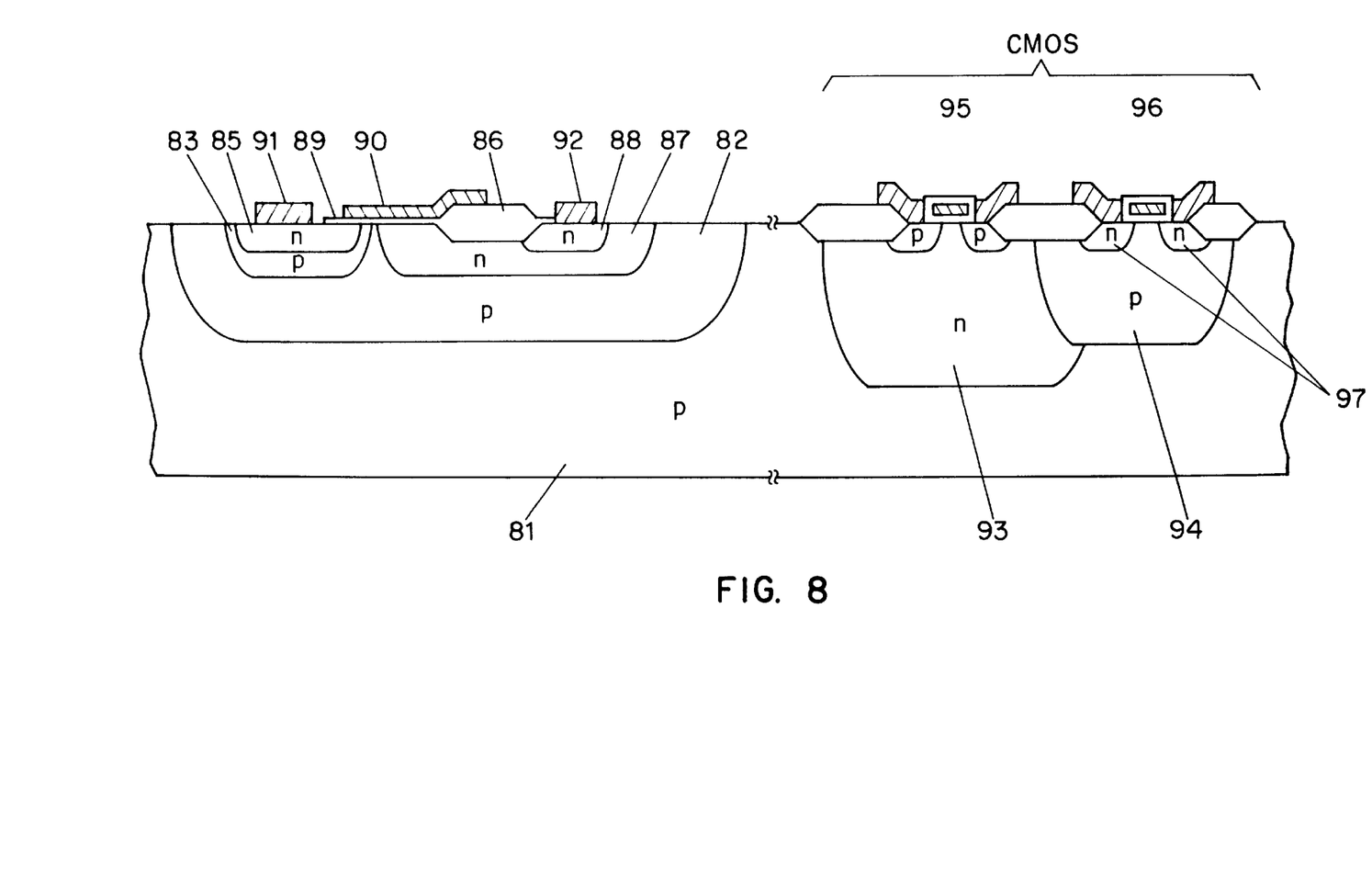
FIG. 8 is a cross section of an integrated circuit including a third embodiment of an n-channel MOSFET according to the present invention.

FIG. 8 is a cross section showing a third embodiment of the present invention on the left hand side of the figure. On the right hand side of FIG. 8, a CMOS (NMOSFET, PMOSFET) is shown integrated into a same silicon substrate with the MOSFET of the invention. In the same manner as in the first embodiment of FIG. 1, a p-type well region 82 is formed in a surface layer of a p-type substrate 81. An n-type source region 85 and an n-type offset region 87 are formed in a surface layer of the p-type well region 82. A thick oxide film (LOCOS) 86 is deposited on the n-type offset region 87. An n-type drain 88 is formed in the surface layer of the n-type offset region 87 laterally spaced by the LOCOS 86 away from the source region 85. A gate electrode 90 is fixed via a gate oxide film 89 on a portion of the p-type well region 82 extending between the n-type offset region 87 and the n-type source region 85. A source electrode 91 and a drain electrode 92 are disposed in the same manner as in the first embodiment. The CMOS, shown on the right hand side of FIG. 8, consists of a p-channel MOSFET 95 and an n-channel MOSFET 96. The third embodiment is different from the first embodiment in that a p-type base region 83, doped more heavily than the p-type well region 82, is formed outside the n-type source region 85 in the p-type well region 82. This structure has an advantage over the first and second embodiments in that the threshold voltage of the high breakdown voltage MOSFET can be controlled by optimizing the impurity concentration of the p-type base region 83.

In the above example, a heavily doped p-type base region is formed on a p-type substrate. The heavily doped p-type base region may also be formed on an n-type well region formed on a p-type substrate, on an n-type substrate or on a p-type well region formed on an n-type substrate.

The trade-off relationship between the breakdown voltage and on-resistance of the lateral field effect transistors showing high breakdown voltage is improved according to the present invention by promoting depletion of an offset region by means of the impurity distributions in the offset region and the surroundings, and by making the impurity concentration of the well region high.

We claim:

1. A lateral field effect transistor having a breakdown voltage and an on-resistance comprising:

a semiconductor layer of a selected conductivity type;

a diffused well region of a first conductivity type having an impurity concentration and formed in a surface layer of said semiconductor layer;

a source region of a second conductivity type opposite to said first conductivity type formed in a surface layer of said well region;

an offset region of said second conductivity type formed in a surface layer of said well region and spatially separated from said source region, said offset region having a surface concentration and a diffusion depth, wherein said impurity concentration of said well region is graded to decrease from a maximum value proximate and below said offset region to a minimum value proximate said semiconductor layer, said breakdown voltage is a function of said surface concentration and said diffusion depth, said on-resistance is a function of said impurity concentration and said diffusion depths, said surface concentration of said offset region is approximately at least $5 \times 10^{16}$ cm$^{-3}$, said surface concentration of said offset region is approximately not more than $2 \times 10^{17}$ cm$^{-3}$, said diffusion depth of said offset region is approximately at least 0.5 $\mu$m, said diffusion depth of said offset region is approximately not more than 1.5 $\mu$m, said maximum value is approximately at least $5 \times 10^{15}$ cm$^{-3}$, and said maximum value is approximately not more than $3 \times 10^{16}$ cm$^{-3}$.

2. The lateral field effect transistor of claim 1, further comprising a relatively thin oxide film formed on a portion of said well region extending between said source region and said offset region, and a relatively thick oxide film formed on a part of said offset region.

3. The lateral field effect transistor of claim 2, further comprising a drain region of said second conductivity type formed in a surface layer of said offset region, said drain region being spaced by said thick oxide film away from said source region.

4. The lateral field effect transistor of claim 2, further comprising a polycrystalline silicon gate electrode fixed to said thin oxide film.

5. The lateral field effect transistor of claim 1, further comprising a source electrode fixed to said source region.

6. The lateral field effect transistor of claim 3, further comprising a drain electrode fixed to said drain region.

7. The lateral field effect transistor of claim 1, wherein said selected conductivity type is said first conductivity type.

8. The lateral field effect transistor of claim 7, wherein said first conductivity type is of p-type and said second conductivity type is of n-type.

9. The lateral field effect transistor of claim 1, wherein said selected conductivity type is said second conductivity type.

10. The lateral field effect transistor of claim 9, wherein said first conductivity type is of n-type and said second conductivity type is of p-type.

11. The lateral field effect transistor of claim 1, further comprising a base region of said first conductivity type doped more heavily than said well region, said base region surrounding said source region laterally and from the bottom thereof.

* * * * *

UNITED STATES PATENT AND TRADEMARK OFFICE
CERTIFICATE OF CORRECTION

PATENT NO. : 5,917,217

DATED : June 29, 1999

INVENTOR(S) : Kitamura et al.

It is certified that error appears in the above-identified patent and that said Letters Patent is hereby corrected as shown below:

On the title page Column 2, [57] ABSTRACT, line 19: "0.17 $\omega mm^{-2}$" should read -- 0.17 $\Omega mm^{-2}$ --;

Column 1, line 66, "0.143 $\omega mm^{-2}$" should read -- 0.143 $\Omega mm^{-2}$ -- ;

Column 4, line 17, "15 $\omega \cdot cm$" should read -- 15 $\Omega \cdot cm$ -- ;

Column 4, line 66, "0.17 $\omega mm^{-2}$" should read -- 0.17 $\Omega mm^{-2}$ --;

Column 5, line 58, "0.5 $\omega mm^{-2}$" should read -- 0.5 $\Omega mm^{-2}$ --;

Column 5, line 65, "15 $\omega \cdot cm$" should read -- 15 $\Omega \cdot cm$ --;

Column 7, line 29, "depths," should read -- depth, --.

Signed and Sealed this

Twelfth Day of September, 2000

*Attest:*

Q. TODD DICKINSON

*Attesting Officer*     *Director of Patents and Trademarks*